US009292626B2

(12) United States Patent
Nelaturi et al.

(10) Patent No.: US 9,292,626 B2
(45) Date of Patent: Mar. 22, 2016

(54) COMPUTER NUMERICAL CONTROL (CNC) MACHINING TOOL AND METHOD FOR CONTROLLING A CNC MACHINING TOOL

(71) Applicant: Palo Alto Research Center Incorporated, Palo Alto, CA (US)

(72) Inventors: Saigopal Nelaturi, Palo Alto, CA (US); Gregory Burton, Mountain View, CA (US); Tolga Kurtoglu, Freemont, CA (US); Christian Fritz, Palo Alto, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 547 days.

(21) Appl. No.: 13/710,381

(22) Filed: Dec. 10, 2012

(65) Prior Publication Data
US 2014/0163720 A1 Jun. 12, 2014

(51) Int. Cl.
*G06F 17/50* (2006.01)
*G05B 19/4093* (2006.01)
*G05B 19/4099* (2006.01)
*G06T 15/40* (2011.01)
(Continued)

(52) U.S. Cl.
CPC ............ *G06F 17/50* (2013.01); *G05B 19/4069* (2013.01); *G05B 19/4099* (2013.01); *G05B 19/40938* (2013.01); *G06T 15/40* (2013.01); *G06T 17/10* (2013.01); *G05B 2219/35097* (2013.01)

(58) Field of Classification Search
CPC ............... G06F 17/50; G05B 19/4069; G05B 19/40938; G05B 19/4099; G05B 2219/35097; G06T 15/40; G06T 17/10

USPC ......... 700/159, 171, 173, 178, 180, 182, 184, 700/186, 192; 703/2, 6, 7
See application file for complete search history.

(56) References Cited

U.S. PATENT DOCUMENTS 4,618,924 A * 10/1986 Hinds ............... G05B 19/41
318/568.1
5,091,861 A * 2/1992 Geller et al. ........... 700/192
(Continued)

OTHER PUBLICATIONS

W. Fu et al., "A Graph Grammar Based Approach to Automated Manufacturing Planning," Proc. ASME 2012 Int'l Design Engr. Tech. Confs. & Comps. and Info. in Engr. Conf. (Aug. 12-15, 2012).
(Continued)

*Primary Examiner* — Charles Kasenge
(74) *Attorney, Agent, or Firm* — Patrick J. S. Inouye

(57) ABSTRACT

A Web-based system and method uses a model of the manufacturing setup and knowledge of a designed part with arbitrary geometry to produce process plans in two successive stages. First, the part geometry is analyzed. A query of determining the maximal volume machinable from an oriented machining tool is transformed into determining the visibility of the part surface from the perspective of a hypothetical camera placed at the tip of the oriented machining tool. Second, a collection of the maximal machinable volumes over the set of all tool orientations is collected. Combinations of the maximal machinable volumes covering the entire difference between the raw stock and the desired part are evaluated for providing feedback on manufacturability and process plans. In a further embodiment, manufacturability is analyzed for tools and machines with arbitrary geometric complexity using high dimensional configuration space analysis.

25 Claims, 10 Drawing Sheets

(51) Int. Cl.
*G06T 17/10* (2006.01)
*G05B 19/4069* (2006.01)

(56) References Cited

U.S. PATENT DOCUMENTS

| | | | | |
|---|---|---|---|---|
| 5,710,709 | A * | 1/1998 | Oliver | G05B 19/4067 700/184 |
| 6,632,053 | B2 * | 10/2003 | Koch | G05B 19/4061 409/132 |
| 6,862,560 | B1 * | 3/2005 | Edwards et al. | 703/7 |
| 7,024,272 | B2 * | 4/2006 | Thomas et al. | 700/182 |
| 7,065,420 | B1 | 6/2006 | Philpott et al. | |
| 7,103,519 | B2 | 9/2006 | Singarajan et al. | |
| 7,496,420 | B2 | 2/2009 | Red et al. | |
| 8,060,237 | B2 | 11/2011 | Franzen et al. | |
| 8,095,229 | B2 | 1/2012 | Muser et al. | |
| 2002/0095236 | A1 * | 7/2002 | Dundorf | G05B 19/4069 700/182 |
| 2003/0204284 | A1 * | 10/2003 | Thomas | G05B 19/4097 700/175 |
| 2003/0204285 | A1 * | 10/2003 | Thomas | G05B 19/4097 700/182 |
| 2004/0186612 | A1 * | 9/2004 | Edwards | G05B 19/4069 700/160 |
| 2009/0030661 | A1 | 1/2009 | Bouffiou et al. | |
| 2013/0116990 | A1 * | 5/2013 | Montana | G06T 19/00 703/2 |

OTHER PUBLICATIONS

D. Vukelic et al., "A Rule-Based System for Fixture Design," Sci. Research and Essays, vol. 6(27), pp. 5787-5802 (2011).
H.T. Ilies et al., "Dual of Sweep," Comp. Aid. Design, 31(3):185-201 (1999).
X. Kang et al., "Recent Research on Computer-Aided Fixture Planning," Recent Patents on Mechanical Engr., vol. 2, pp. 8-18 (2009).
S. Nelaturi et al., "Solving Inverse Configuration Space Problems by Adaptive Sampling," Symp. Solid & Phys. Model. 2012 (2012).
S. Nelaturi et al., "Configuration Products and Quotients in Geometric Modeling," Comp. Aid. Design (2012).
S. Nelaturi et al., "Rapid Mapping and Exploration of Configuration Space," Proc. ASME 2011 Int'l Design Engr. Tech. Confs. & Comps. and Info. in Engr. Conf. (Aug. 29-31, 2011).
B. V. Blarigan et al., "Automated Estimation of Time and Cost for Determining Optimal Machining Plans," Proc. ASME 2012 Int'l Design Engr. Tech. Confs. & Comps. and Info. in Engr. Conf. (Aug. 12-15, 2012).
J.A. Carter et al., "3-Axis CNC Path Planning Using Depth Buffer and Fragment Shader," Comp. Aid. Design and Applications (2008).
A. A. Eftekharian et al., "Draft: Convex Decomposition of 3D Solid Models for Automated Manufacturing Process Planning Applications," Proc. ASME 2012 Int'l Design Engr. Tech. Confs. & Comps. and Info. in Engr. Conf. (Aug. 12-15, 2012).
M. Lysenko et al., "Group Morphology with Convolution Algebras," Spatial Automation Laboratory University of Wisconsin—Madison.
C. B. Barber et al., "Qhull," (1995) (/www.geom.umn.edu/software/qhull), operated by the University of Minnesota, Minnesota, MN University of Minnesota.
B. Naylor et al., "Merging BSP Trees Yields Polyhedral Set Operations," ACM SIGGRAPH Comp. Graphics, vol. 24 (4), pp. 115-124 (1990).
Carr Lane Modular Fixturing manual, www.carrlane.com.
ZM Bi and WJ Zhang, "Flexible Fixture Design and Automation: Review, Issues and Future Directions." International Journal of Production Research, 39(13):2867-2894, 2001.
A. Bicchi and V. Kumar, "Robotic Grasping and Contact: A review." in Robotics and Automation, 2000. Proceedings. ICRA'00. IEEE International Conference on, vol. 1, pp. 348-353. IEEE, 2000.
R. C. Brost et al., "A CAD Tool That Automatically Designs fixtures and Pallets." Presented at Autofact'95, Chicago IL, Nov. 1995.
D. Ding et al., Computation of Fingertip Positions for a Form-Closure Grasp. Proceedings of the 2001 IEEE International Conference on Robotics & Automation, pp. 2217-222., Seoul, Korea, May 21, 2004.
B. Mishra et al., "On the Existence and Synthesis of Multifinger Positive Grips." Algorithmica, 2(1):541-558, 1987.
V.D. Nguyen, "Constructing Force-Closure Grasps." The International Journal of Robotics Research, 7(3):3-16, 1988.
E. Rimon et al., "On Force and Form Closure for Multiple Finger Grasps." in Robotics and Automation, 1996. Proceedings., 1996 IEEE International Conference on, vol. 2, pp. 1795-1800. IEEE, 1996.
J. C. Trappey et al., A Literature Survey of Fixture Design Automation. The International Journal of Advanced Manufacturing Technology, 5(3):240-255, 1990.
J.C. Trinkle, A Quantitative Test for Form Closure Grasps. in Intelligent Robots and Systems, 1992., Proceedings of the 1992 IEEE/RSJ International Conference on, vol. 3, pp. 1670-1677, Jul. 1992.
A. S. Wallack et al., "Planning for Modular and Hybrid Fixtures." Algorithmica, 19(1):40-60, 1997.
M. Y. Wang, "An Optimum Design for 3-D Fixture Synthesis in a Point Set Domain." Robotics and Automation, IEEE Transactions on, 16(6):839-846, 2000.
C. Wentink et al., "Algorithms for fixture design." Citeseer, 1996.
Y. Zheng et al., "A Fast N-Dimensional Ray-Shooting Algorithm for Grasping Force Optimization." in Robotics and Automation (ICRA), 2010 IEEE International Conference on, pp. 1300-1305. IEEE, 2010.
Y. Zheng et al., "Efficient Simplex Computation for Fixture Layout Design." Computer-Aided Design, 43(10):1307-1318, 2011.

* cited by examiner

COMPUTER NUMERICAL CONTROL (CNC) MACHINING TOOL AND METHOD FOR CONTROLLING A CNC MACHINING TOOL

FIELD

This application relates in general to computer numerical control (CNC) machining and, in particular, to a CNC machining tool and method for controlling a CNC machining tool with the aid of a digital computer.

BACKGROUND

The machining of a part from raw stock or material, usually metal, is a form of subtractive manufacturing during which the raw material is progressively removed until the part reaches an intended shape and size. Operations during machining primarily involve turning, drilling and milling the raw material into the desired part, which respectively require removing the raw material by rotating the raw material against a stationary cutting tool, axially boring holes using a rotating bit with a cutting edge on a distal end whilst the raw material is held stationary, and cutting away the raw material using a rotating bit with cutting edges generally along the rotating bit's sides and distal end. Both drilling and milling involve traversing a rotating bit along a longitudinal axis in the Z-direction. Milling, which operates in three-dimensional space, also involves moving the rotating bit along a plane in X- and Y-directions. Other kinds of machining operations and tools also exist. The machining will generally reduce the raw material into rough form within a specified tolerance; further manufacturing processes may be required to smooth, polish, finish, or otherwise transform the part into final form.

As with other facets of product lifecycle management, machining has benefited from increased integration of computerization. For instance, digitally-automated milling machines can be programmed to manufacture parts from raw materials using computer numerical control (CNC) machining instructions, which are typically generated through computer-aided manufacturing (CAM) software based on user-driven inputs combined with automated post-planning process validation. The part is digitally represented through an electronically-stored model output from a computer-aided design (CAD) program, and the CAM software uses the part's digital model, along with a model of the manufacturing setup, including the machining tools, to create the set of machining instructions.

Despite the advances in parts design and manufacture made possible by CAD, CAM and related digital manufacturing software initiatives, conventional efforts still focus primarily on assisting validation of human-generated manufacturing process plans in an effort to better support efficient integration between product lifecycle management and physical shop floor production. In general, these software initiatives provide virtual environments that enable modeling, planning, simulation, and analysis of manufacturing processes, as supported by algorithms for path planning, collision detection, cycle time calculations, layout modeling and resource allocation, and validate user-driven inputs, ranging from a single operation to an entire manufacturing program.

Nevertheless, a problem remains in synthesizing a manufacturing process plan that defines a sequence of machining instructions, such as expressible in a CNC program, to produce a part from raw stock. Depending on part complexity, addressing this problem manually and without automation may be a time-consuming and expensive effort. Moreover, the exercise can potentially occupy a large segment of the process planning stage and will invariably require human intervention, creativity and experience to sufficiently define the process before its execution may be validated with a suite of digital manufacturing tools.

The inverse problem, that of defining a process plan for manufacturing a mechanical part through digitally-automated machining, is likewise ill-posed, for there are typically multiple solutions, with the space of solutions growing with the increasing geometric complexity of the part and the availability of a larger set of machining tools. Furthermore, process plans are influenced by machine-specific parameters, setup and manufacturing time and costs, design tolerances, layout planning, and so forth. The solution space becomes intractable and lacks process-driven feedback that could guide manufacturability analysis and process planning selection. Conventional solutions to producing manufacturing process plans for parts with arbitrary geometric complexity fail to resolve these problems.

For instance, W. Fu et al., "A Graph Grammar Based Approach to Automated Manufacturing Planning," Proc. ASME 2012 Int'l Design Engr. Tech. Confs. & Comps. And Info. In Engr. Conf. (Aug. 12-15, 2012), the disclosure of which is incorporated by reference, describes a graph grammar representation for reasoning about parts manufacturability. A part is decomposed into multiple sub-volumes with each sub-volume assumed to either be machinable in one operation or non-machinable. The decomposed part is converted into a graph and a candidate manufacturing plan is generated as a sequence of all machining operations necessary to manufacture the part based on the assumptions that the sub-volumes are machinable. However, dependence on part decomposition restricts the class of parts considered manufacturable, and the graph grammar approach relies on heuristics whose application dramatically increases the solution space that must be explored, which considerably slows down the evaluation of manufacturability.

Therefore, a need remains for an approach to validating whether a designed part is fundamentally manufacturable and, if so, through what sequence of manufacturing process plans.

SUMMARY

A Web-based system and method uses a model of the manufacturing setup and knowledge of a designed part with arbitrary geometry to produce process plans in two successive stages. First, the part geometry is analyzed. A query of determining the maximal volume machinable from an oriented machining tool is transformed into determining the visibility of the part surface from the perspective of a hypothetical camera placed at the tip of the oriented machining tool. Second, a collection of the maximal machinable volumes over the set of all tool orientations is collected. Combinations of the maximal machinable volumes covering the entire difference between the raw stock and the desired part are evaluated for providing feedback on manufacturability and process plans. In a further embodiment, manufacturability is analyzed for tools and machines with arbitrary geometric complexity using high dimensional configuration space analysis.

One embodiment provides a computer-implemented system and method for generating process plans for a machined part through evaluation of removal volumes. Parameters for a milling tool that include a plurality of orientations of the tool while longitudinally traversing a rotating cutting edge are retrieved. A model of a part defining surfaces of the part is accessed. A maximal set of translations for the tool that avoids collisions between the rotating cutting edge and the surfaces of the part is retrieved. Each translation includes an orientation of the tool and a volume removable by the translation. An intersection of the translations within the maximal set is computed. A union of the removal volumes for the intersecting translations is taken. Process plans that include machining operations by the tool are determined, as conditioned upon the union substantially equaling the negative volume of the part.

A further embodiment provides a computer-implemented system and method for analyzing machined part manufacturability through convolution. Parameters for a milling tool are retrieved that include a plurality of orientations of the tool while longitudinally traversing a rotating cutting edge. A model of a part defining surfaces of the part is accessed. A maximal machinable volume of the part for each of the orientations of the tool is determined. A maximal set of translations of the tool that avoids collisions between the rotating cutting edge and the surfaces of the part is computed. A largest space of the maximal set of the translations of the tool outside of the surfaces of the part, which is machinable by the tool, is determined. An intersection of the maximal set of the translations of the tool is taken as a maximal machinable volume for the tool. Manufacturability of the part is evaluated based upon whether a union of the maximal machinable volumes substantially equals a negative volume of the part. Process plans that include machining operations by the tool are determined as conditioned upon the part being manufacturable.

A further embodiment provides a computer-implemented system and method for analyzing machined part manufacturability through dimensional reduction and visibility analysis. Parameters for a milling tool are retrieved that include a plurality of orientations of the tool while longitudinally traversing a rotating cutting edge. A model of a part defining surfaces of the part is accessed, wherein the part lacks undercut features. Non-colliding transformations of the tool are determined. A heightmap of the part orthographically to an approach of the tool relative to the surfaces of the part is computed from an origin of the tool. A heightmap of the tool centered on the tool's origin and looking towards a direction moving away from the surfaces of the part is computed. A heightmap of a removal volume that includes a volume created by sweeping the tool over the surfaces of the part is created. Upon identifying a collision between the taking an intersection of the tool with the surfaces of the part for each point in the heightmap of the tool, a translation of the tool by a penetration depth of the tool in the direction moving away from the surfaces of the part is generated. Manufacturability of the part is evaluated based upon whether a union of the non-colliding transformations of the tool substantially equals a negative volume of the part. Process plans that include machining operations by the tool are determined as conditioned upon the part being manufacturable.

The problem of synthesizing detailed and multiple manufacturing process plans based on part manufacturability analysis is unique in the digital manufacturing spectrum and fills an important gap in the production lifecycle. Conventionally, design and manufacturing are considered two separate departments and much of the efforts in digital manufacturing for machining has focused on simulating machines and processes for engineers to manually validate their designs and process plans. The approach described herein not only synthesizes process plans, but also provides fast feedback to the designer and process engineer, and is deployable online through the Web.

Still other embodiments of the present invention will become readily apparent to those skilled in the art from the following detailed description, wherein is described embodiments of the invention by way of illustrating the best mode contemplated for carrying out the invention. As will be realized, the invention is capable of other and different embodiments and its several details are capable of modifications in various obvious respects, all without departing from the spirit and the scope of the present invention. Accordingly, the drawings and detailed description are to be regarded as illustrative in nature and not as restrictive.

DETAILED DESCRIPTION

Prior Art Validation of Human-Generated Manufacturing Process Plans

Traditionally, design and manufacture within an organization are operated as closely-related, yet functionally separate spheres of activity. Product design generally occurs first, followed by product realization and manufacture. The design of a part is treated as a discrete output from a design department and the validation of human-generated process plans for manufacturing the part occurs between the conclusion of design and commencement of product manufacturing.

Figure 1:
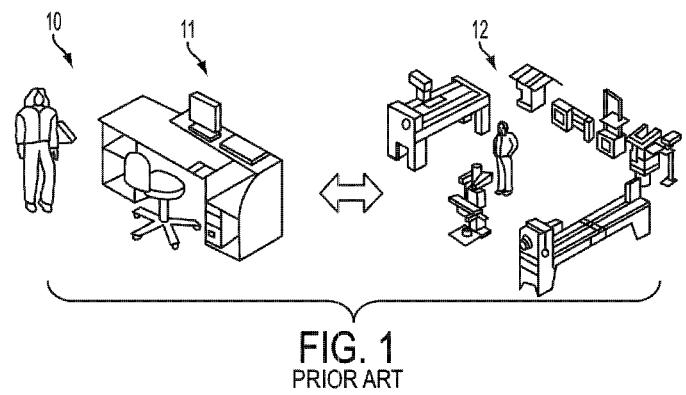
FIG. 1 is a functional block diagram showing, by way of example, a prior art system for validation of human-generated manufacturing process plans.

Conventional approaches to manufacturing process planning strive to better integrate product lifecycle management and physical shop floor production, while incidentally emphasizing the distinctions between design and manufacture. FIG. 1 is a functional block diagram showing, by way of example, a prior art system 10 for validation of human-generated manufacturing process plans. Manufacturability is evaluated during a subsequent stage in the product lifecycle from design. A product design may have to be iterated between a design department 11 and a manufacturing department 12 until the designed part has ultimately been determined to be manufacturable. The back-and-forth cycling between part design and manufacturing occur as an outgrowth of the activities responsible for their respective execution. The iterations required to perform validation of human-generated manufacturing process plans can be time-consuming and expensive.

System

Manufacturability analysis and automation of process plans are complex problems that rely on advanced geometric reasoning at the part level and combining those results of that reasoning with a model of the manufacturing setup, particularly the tools used to machine each part, to aid both the design and manufacturing engineer. Such functionality is minimally addressed by current approaches, for example, by providing solutions for specific types of features in a part model, providing manufacturing time and cost estimates, or simulating the factory for the engineer to visualize and verify manufacturability.

Figure 2:
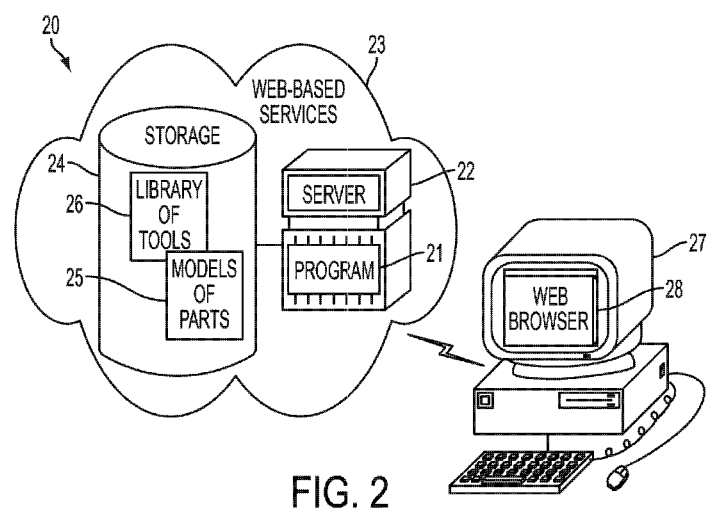
FIG. 2 is a functional block diagram showing a computer-implemented system for analyzing machined part manufacturability and performing process planning in accordance with one embodiment.

By introducing detailed models of a manufacturing setup sooner into the product lifecycle, specifically during the design process, a machined part's design, and therefore the process plans for manufacturing the part, can be assured to be correct by construction, as well as generating feedback on manufacturability and similar concerns. FIG. 2 is a functional block diagram showing a computer-implemented system 20 for analyzing machined part manufacturability and performing process planning in accordance with one embodiment. A Web-based service 23 provides detailed feedback on a specified part's manufacturability by modeling the inherent capabilities of the manufacturing setup. A program 21 is provided through a centralized server 22 that can be remotely accessed via the Web over a wide area public data communications network, such as the Internet, using wired or wireless connections. Users interface with the server 22 through a Web browser 28 executing on a personal computer 27 or similar device. The server 22 is operatively coupled to a storage device 24, within which is stored models of designed parts 25, such as represented using voxels or similar volumetric units, and a library of machining tools 26. Both the server 22 and personal computer 27 include components conventionally found in general purpose programmable computing devices, such as a central processing unit, memory, input/output ports, network interfaces, and non-volatile storage, although other components are possible. In addition, other computational components are possible.

The program 21 implements a geometric engine that executes a set of spatial planning algorithms for automated manufacturability analysis of arbitrary geometric models, without making assumptions on the tool geometry and degrees of freedom, or the existence of surrounding tooling and fixtures. The manufacturing setup model corresponds to the library of machining tools 26 with specifications for each operable tool, and the program 21 connects the available capability of each tool to the uploaded geometric model of each part 25 to provide qualitatively distinct process plans, represented in the form of a JSON ("JavaScript Object Notation") file or similar structured encoding or human-readable format, with detailed feedback for each individual plan. The geometric reasoning algorithms use tooling information from the library 26 to construct a search space of maximal machinable volumes from the part stock for each tool orientation, followed by search algorithms that traverse this space and identify a set of candidate process plans, as further described below beginning with reference to FIG. 6. The program 21 checks to determine if a solution exists in the search space before embarking on a traversal.

Geometric Reasoning Algorithms

The geometric reasoning algorithms are based on mathematical principles relying on properties of the configuration space of rigid motions, and can be implemented abstractly in terms of convolutions on graphics hardware using a personal computer 27 or other similar device. Furthermore, in special cases where the tool geometry does not possess undercut features, algorithms implemented through dimensional reduction and visibility analysis provide significant speedup and resolution as compared to convolution algorithms.

The following definitions will be used:

Dilation, denoted by $\epsilon$ is the map defined by $\delta(M,X) = \cup_{m \in M} X_m$, where $X_m$ represents the solid X transformed by a rigid transformation m. Dilation generalizes the usual notions of one parameter sweeps and Minkowski sum, such as described in J. Serra, *Image Analysis and Mathematical Morphology*, V. 1 (1982), the disclosure of which is incorporated by reference.

Erosion, denoted by $\epsilon$ is the map defined by $\epsilon(M,X) = \cap_{m \in M} X_m$. Erosion generalizes the notions of (one-parameter) unsweep, such as described in H. T. Ilies et al., "Dual of Sweep," Comp. Aid. Design, 31(3): 185-201 (1999), the disclosure of which is incorporated by reference, and Minkowski difference.

Homogeneous configuration product, or simply homogeneous product, is an operation that determines the largest collection of rigid transformations of a moving solid that cause collision with a stationary solid. In the case when the motions of the moving solid T are restricted to translations in the presence of the stationary solid S, the homogeneous product is the translational configuration space obstacle of S and T, such as described in J. C. Latombe, *Robot Motion Planning* (1990), the disclosure of which is incorporated by reference.

Left homogeneous configuration quotient, or simply left quotient, is an operation '▷' that determines all rigid transformations of a moving solid T that cause containment within the stationary solid S. In the translational case, left quotient is related to erosion, such as described in J. Serra, cited supra.

Staging Models

Figure 3:
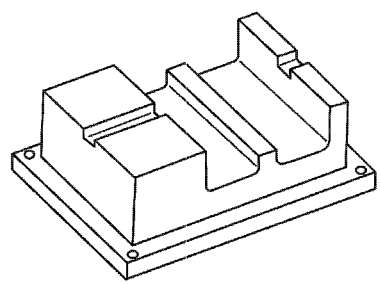
FIG. 3-5 are block diagrams respectively showing, by way of example, a part to be manufactured by milling and two staging models of the part computed for a tool in two distinct orientations using the system of FIG. 2
Figure 4:
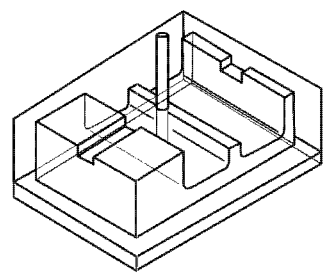
Figure 5:
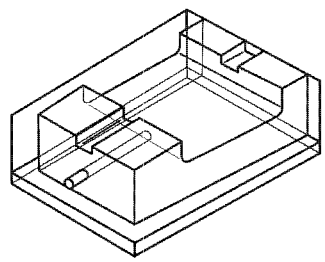

Evaluating the manufacturability of a mechanical part with a library of machines and cutting tools, and determining machining operations on raw metal stock to produce manufacturable parts are problems offering significant scope for automation. FIG. 3-5 are block diagrams respectively showing, by way of example, a part to be manufactured by milling and two staging models of the part computed for a tool in two distinct orientations using the system 20 FIG. 2. Each staging model, which is the remaining uncut material after a machining operation, is typically re-fixtured in several orientations to enable the cutting tool to machine the entire part surface. Given a pair (S, P), where S represents a fixtured raw stock or a staging model and P represents the part to be manufactured, let T represent the tool that is selected to machine P from S. All solids are assumed to be represented as elements of M. At every stage henceforth, P may be replaced by an entire tooling setup, including the part, since the manufacturability analysis implicitly uses collision detection to compute maximal machinable volumes. Referring first to FIG. 3, a model of the designed part is shown. The part is to be manufactured by milling away raw material from a rectangular piece of stock. Referring next to FIGS. 4 and 5, two staging models (yellow) computed for the tool (green) in two distinct orientations machining the raw stock (purple) are shown. The complement of each of the staging models in the rectangular stock material represents the maximal machinable volume.

The staging models indicate that the extension to multiple orientations is straightforward; one simply has to orient the tool T to a desired orientation T* and recompute a maximal machinable volume. If required, the stock S can also be replaced by any staging model while determining a sequence of operations that manufacture the part. Therefore, the analysis to compute maximal machinable volumes for translating tools can be extended to cases where high-axis milling machines are used to perform "multi-sided" milling, that is, translational milling operations with multiple tool orientations. Multi-sided milling facilitates reduced setup time with increased accuracy of machining since the part does not have to be re-fixtured for every tool orientation.

Method

Figure 6:
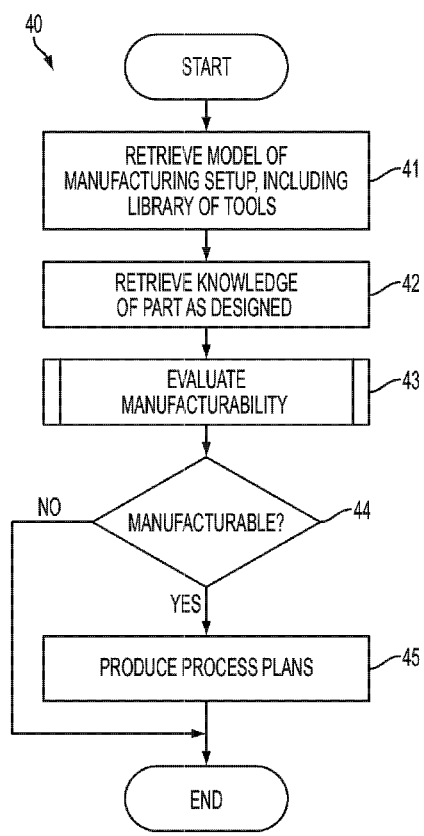
FIG. 6 is a flow diagram showing a computer-implemented method for analyzing machined part manufacturability and performing process planning in accordance with one embodiment.

Spatial planning algorithms determine a sequence of machining operations on raw stock for a large class of tool and stock geometries, without making assumptions on the cutting tool degrees of freedom or the existence of surrounding tooling and fixtures. FIG. 6 is a flow diagram showing a computer-implemented method 40 for analyzing machined part manufacturability and performing process planning in accordance with one embodiment. The method is performed as a series of process or method steps performed by, for instance, a general purpose programmed computer, such as server.

Initially, a model of the manufacturing setup, including a library of the tools to be used to machine the designed part, as well as knowledge of the part as designed, are respectively retrieved (steps 41 and 42). The library stores information on each type of milling tool, including the orientations and positions in which the tool can operate. Spatial planning is then broadly distinguished into two serial stages: initial geometric reasoning that determines part manufacturability in terms of volumes machined by each tool in the library (step 43), as further described infra with reference to FIG. 7, followed by search algorithms that generate plans defined in terms of sequences of removal volumes (step 45), provided that the part is manufacturable (step 44). The removal volume is the volume created by sweeping the tool over the surface of the designed part. The part is manufacturable by the tool provided that the union of the maximal machinable volumes equals the part negative, as further described infra with reference to FIG. 8. In a further embodiment, the part is manufacturable by the tool provided that the sweep of the tool by the union of the non-colliding transformations of the tool equals the part negative, as further described infra with reference to FIG. 10. In still further embodiments, the union of maximal machinable volumes or non-colliding transformations, as appropriate, could be a union of all or a subset of all maximal machinable volumes or non-colliding transformations. As well, the union of maximal machinable volumes or non-colliding transformations could equal the part negative up to a specified tolerance, rather than as an absolute measure. Still other manufacturability criteria are possible.

Manufacturability Evaluation

Figure 7:
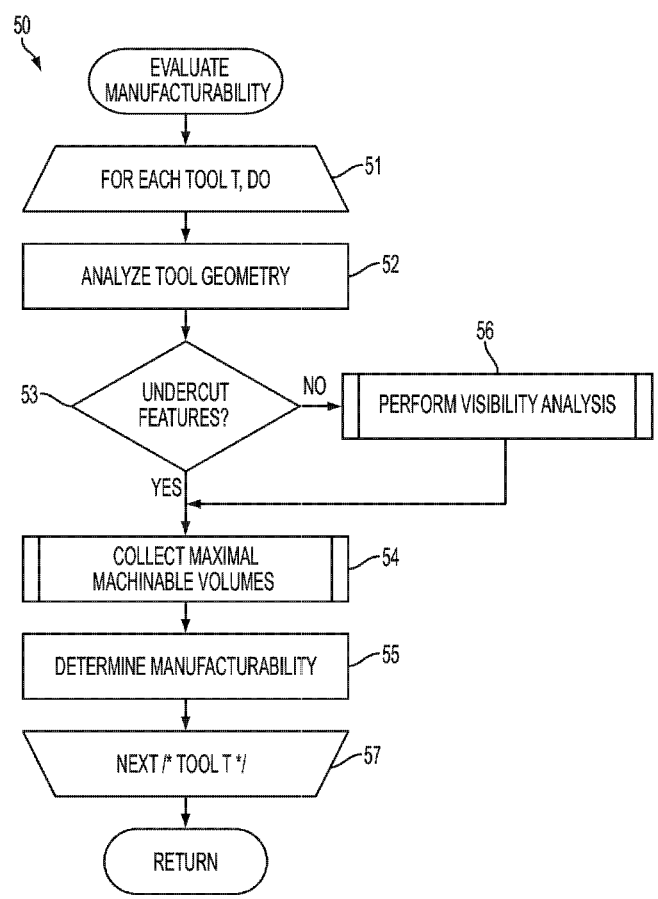
FIG. 7 is a flow diagram showing a routine for evaluating manufacturability for use in the method of FIG. 6.

During manufacturability analysis, advanced geometric reasoning at the part level is combined with a model of the manufacturing setup, particularly the tools used to machine each part, to determine whether the part is manufacturable. FIG. 7 is a flow diagram showing a routine 50 for evaluating manufacturability for use in the method 40 of FIG. 6. Each tool in the library is evaluated (steps 51-57) as follows. First, the geometry of the tool is analyzed (step 52) to determine whether the designed part requires the tool to possess undercut features. If undercut features are required (step 53), the maximal volumes machinable by the tool in each orientation are collected (step 54), as further described infra with reference to FIG. 8. Where the tool geometry does not possess undercut features (step 53), algorithms implemented through dimensional reduction and visibility analysis can be performed (step 56), as further described infra with reference to FIG. 9, in lieu of the convolution algorithms performed when collecting the maximal machinable volumes. Finally, manufacturability is determined (step 55) based on the collected maximal machinable volumes or visibility analysis, as applicable. Processing continues with each tool in the library (step 57).

Collection of Maximal Machinable Volumes

Figure 8:
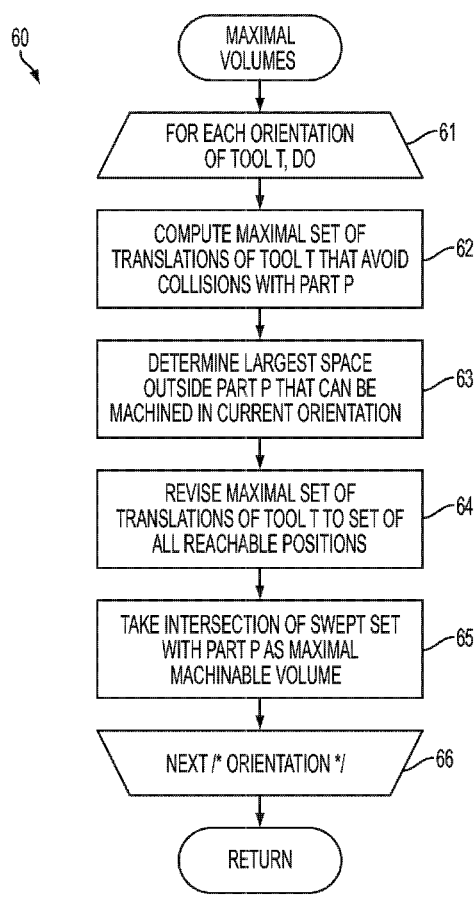
FIG. 8 is a flow diagram showing a routine for collecting maximal machinable volumes for use in the routine of FIG. 7.

Collecting the maximal machinable volumes for a tool T requires determining the largest subset of a raw fixtured stock S that may be removed by the tool T without interfering with the designed part P. FIG. 8 is a flow diagram showing a routine for collecting maximal machinable volumes for use in the routine of FIG. 7. To simplify exposition, the problem is initially defined as determining the maximal machinable volume from a stationary stock using a translating tool. This situation is manifested in practice, for example, when three-axis milling machines are used to cut metal from fixtured stock. Extending the formulation for a single translating tool to account for several relative orientations between the tool and part is straightforward.

Each orientation of a tool T is evaluated (steps 61-66) as follows. For a part P to be manufacturable, a fixtured raw stock S is placed within a set of positions that a reference point on the tool T can reach in the current orientation. The part P is manufacturable by the tool T if and only if the union of all maximal machinable volumes equals the part negative, that is, the part P volumetrically subtracted from fixtured raw stock S.

First, a maximal set of translations of tool T that avoid collisions with the part P is computed (step 62). Assume that the origin of the absolute coordinate system coincides with the reference point on the tool T. By definition of the homogeneous quotient, the maximal set of translations applicable to the tool T to remain within $P^c$, that is, without collision with P, is:

$$P^c \triangleright T = P^c \ominus T^{-1} \quad (1)$$

which outlines the largest subset of the entire space of translations that is applicable to the tool T in the current orientation (step 63).

In practice, however, machining is going to be limited by the available workspace, or the set of positions and orientations achievable by the tool. The current situation involving a fixed orientation is only concerned with the set of all reachable positions, or the reachable workspace of the tool. Denoting the reachable workspace as R, the maximal set $K \subset \mathbb{R}^3$ of translations applicable to the tool T (step 64) is revised as:

$$K = (P^c \ominus T^{-1}) \cap R \quad (2)$$

Thus, the sweep $\delta(K, T)$ represents the sweep of the tool by the maximal set of allowable translations, without interfering with the geometry of the part P.

Finally, the maximal volume that is machinable from the raw stock (or staging model) S (step 65) is given by:

$$V_{max} = \delta(K,T) \cap S \quad (3)$$

The sweep $\delta(K, T)$ does not need to be intersected with the part negative because, by construction, the swept volume of the tool T by the computed subset of the reachable workspace is guaranteed to remain outside the part geometry. Processing continues with each orientation of the tool T (step 66).

Visibility Analysis

In a further embodiment, manufacturability is analyzed for tools and machines with arbitrary geometric complexity using high dimensional configuration space analysis. In the event that the maximal machinable volume computed per Equation (3) exposes a portion of the part boundary, the accessible boundary $\delta P_{acc}$ is given precisely by $\kappa(V_{max}) \cap \partial$ (P), where κ(X) and ∂(X) represent the closure and boundary of a set X, respectively. Conversely, δP$_{acc}$ is the complete subset of the part boundary that is exposed when the tool machines the maximal removable volume from the stock or staging model in a fixed orientation.

Infinitely-Long and Zero-Thickness Tools

Consider a limiting case when the tool T has infinite length and zero thickness. Equation (3) then implies that the tool approaching any point in P$_{acc}$ along the orientation of interest will not interfere with the fixed part. In this extreme case, the entire set P$_{vis}$ ⊂ ∂(P) that is visible along the specified orientation is machinable. More generally, for an infinitely long tool (or a tool that can be considered infinitely long for the purposes of discussion) without undercut features, a ray originating from any point x∈P$_{acc}$ will necessarily intersect the tool in a non-colliding configuration at some point y∈T, such that the line segment joining x and y is entirely in the free physical space P$^c$. Therefore, every point in P$_{acc}$ is said to be visible from such a tool.

To avoid computing the entire set P$^c$⊖T$^{-1}$, per Equation (1), in this special case, when T is infinitely long without undercut features, V$_{max}$ can be computed through visibility analysis. First, for tools with non-zero thickness, P$_{acc}$≠P$_{vis}$. Among the visible tool positions, the set P$_{inacc}$ ⊂ P$_{vis}$ represents inaccessible positions, such that δ(P$_{inacc}$,T)∩P≠∅. Therefore, to arrive at the maximal machinable volume, P$_{vis}$ is first computed and subsequently δ(P$_{inacc}$,T) is extracted by observing that dilation is distributive over set union:

$$P_{vis} = P_{acc} \cup P_{inacc} \quad (4)$$

$$\delta(P_{vis}, T) = \delta(P_{acc}, T) \cup \delta(P_{inacc}, T) \quad (5)$$

$$\delta(P_{vis}, T) - \delta(P_{inacc}, T) = \delta(P_{acc}, T) \quad (6)$$

$$V_{max} = \delta(P_{acc}, T) \cap S \quad (7)$$

This formulation of V$_{max}$ is equivalent to Equation (3) when the tool is infinitely long. From the perspective of implementing the computation of V$_{max}$, the approach using visibility for the class of tools is an efficient alternative.

Visibility is implicitly encoded in terms of height maps. In turn, the removal volume is computed from a removal heightmap R$_{Hmap}$ by projecting each point (x, y, z) in a three-dimensional planning space (X, Y, Z) into the tool's (X', Y', Z') coordinate system and determining whether a point (x', y', z') in that space is above or below R$_{Hmap}$ (x', y'). More precisely, the point (x', y', z') is in the removal volume if z'<R$_{Hmap}$ (x', y').

Visibility is defined from a given direction in terms of unobstructed rays originating from infinity contacting the surface. If infinity is replaced with some finite, but sufficiently large distance, then a sampling of the visible points on the surface may be computed using standard z-buffer hidden surface removal with orthographic projection. In computer graphics, z-buffering is the standard approach for computing, for every pixel in an image, the distance to the nearest surface, so that distant surfaces are correctly occluded by nearer surfaces. The z-buffer algorithm is simply to retain a heightmap, initially set to infinity for all pixels, attempt to draw every pixel of every triangle in a tessellated model, only draw a given pixel if the distance to the triangle at that pixel is less than whatever value is currently in the z-buffer for that pixel, and, if so, update the z-buffer.

Figure 9:
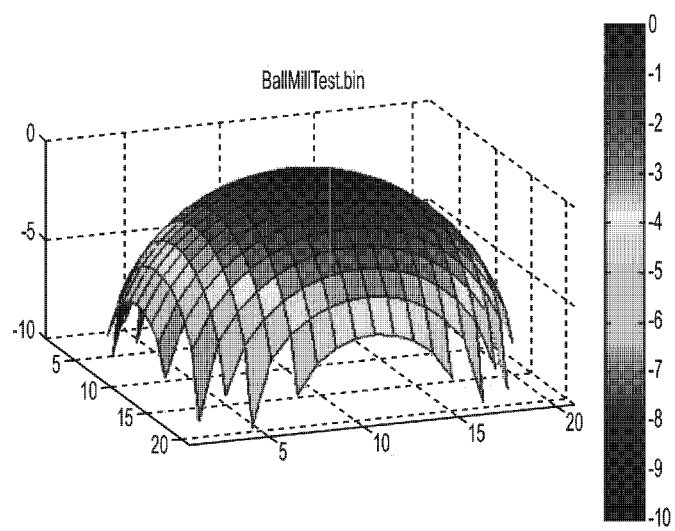
FIG. 9 is a diagram showing, by way of example, the heightmap of the contact surface of a ball-end mill.

The standard nomenclature for axes in a three-axis milling machine is that the tool spins about the Z-axis, and movement towards the part is said to be movement in the +Z direction. The tool can translate along X, Y, or Z, and only rotates about Z. Ignoring rotation about Z (assuming a rotationally symmetric tool, or that the tool is represented by its swept volume), the heightmap computed with the z-buffer algorithm maps directly to the state space and allowable transformations of the tool. For any (X, Y) pair, the corresponding heightmap value is an upper bound on the distance that the tool can translate in the +Z direction without colliding with the interior of the part. For an infinitesimally thin tool, the heightmap value is exact, but for a finite thickness tool, collision is still an issue, which is why P$_{acc}$≠P$_{vis}$ and P$_{inacc}$ ⊂ P$_{vis}$. From the perspective of the part, the leading surface of an undercut-free tool is the visible portion of the tool when viewed in the −Z direction. FIG. 9 is a diagram showing, by way of example, the heightmap of the contact surface of a ball-end mill, expressed as a height map in voxels or similar volumetric units. As the tool approaches the part, the tool is said to be moving in the +Z direction, so the contact surface is the surface of the tool with the largest Z-axis value.

Figure 10:
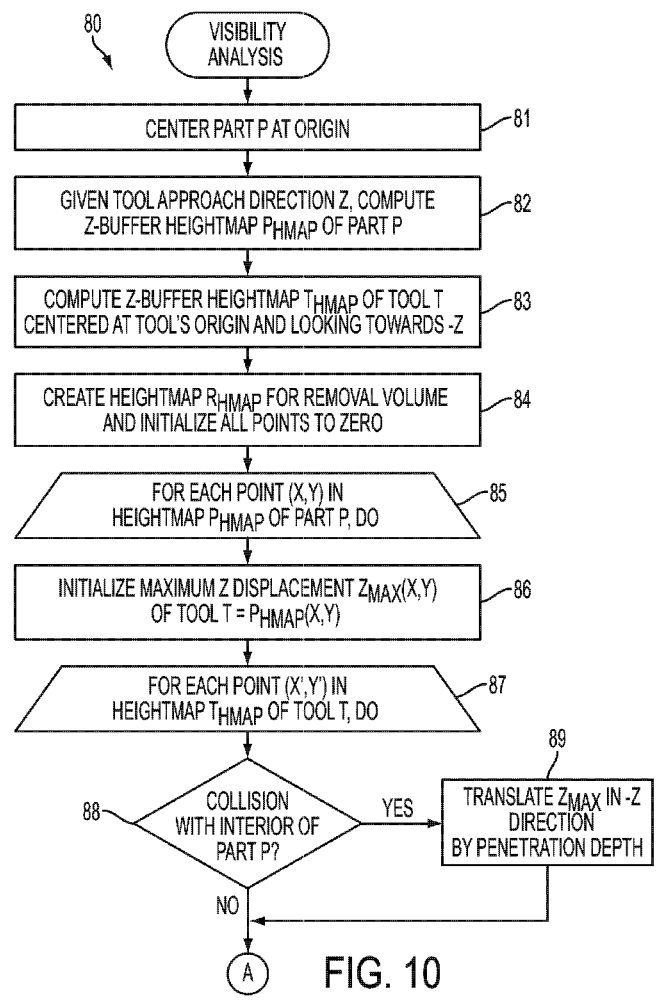
FIG. 10 is a flow diagram showing a routine for performing a visibility analysis for use in the routine of FIG. 7.
Figure 10:
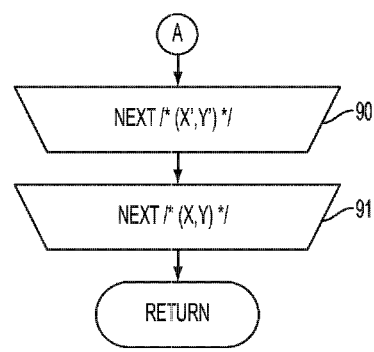

The important insight is that the −Z direction is the direction leading away from the part, and by moving in the −Z direction, an infinitely long undercut-free tool cannot transition from a non-colliding to a colliding state with the part. Rather, the tool can only transition from colliding to non-colliding, and, for a finite part, a colliding tool is guaranteed to eventually transition to a non-colliding state. Therefore, for a given (X, Y), to find the farthest +Z transition, which a non-infinitesimally thin tool can make without colliding with the part, visibility analysis can begin with the upper bound estimate in a z-buffer heightmap and iteratively move the tool in the −Z direction, if a portion of the surface of the tool is colliding with the interior of the part. FIG. 10 is a flow diagram showing a routine 80 for performing a visibility analysis for use in the routine of FIG. 7. First, the part P is centered at the origin (step 81). Given a tool approach direction Z, the z-buffer heightmap P$_{Hmap}$ of the part P is computed (step 82) by rendering the part orthographically from a distant point along −Z. This point is the tool's origin.

Next, the heightmap of the tool T$_{Hmap}$ is computed (step 83) using the same method as above, but with a virtual camera centered at the tool's origin and looking towards −Z. A heightmap for the removal volume R$_{Hmap}$, which is the volume remaining after the tool T is swept over the part without collision, is created and all points are initialized to zero (step 84). Each (X, Y) point in the heightmap of the part P$_{Hmap}$ is processed (steps 85-91) as follows. First, the maximum Z displacement of the tool, Z$_{max}$, is initialized (step 86) as Z$_{max}$(X,Y)=P$_{Hmap}$(X,Y). Each (X',Y') point in the heightmap of the tool T$_{Hmap}$ is checked for collisions (steps 87-90), that is, minX(T$_{Hmap}$)≤X'≤maxX(T$_{Hmap}$) and minY(T$_{Hmap}$)≤Y'≤maxY(T$_{Hmap}$), as follows. If, given the current value for Z$_{max}$, a given (X',Y') point of T$_{Hmap}$ would be colliding with the interior of the part P (step 88), translate Z$_{max}$ in the −Z direction by the penetration depth (step 89). Processing continues for each (X', Y') (step 90) and each (X, Y) (step 91).

Figure 11:
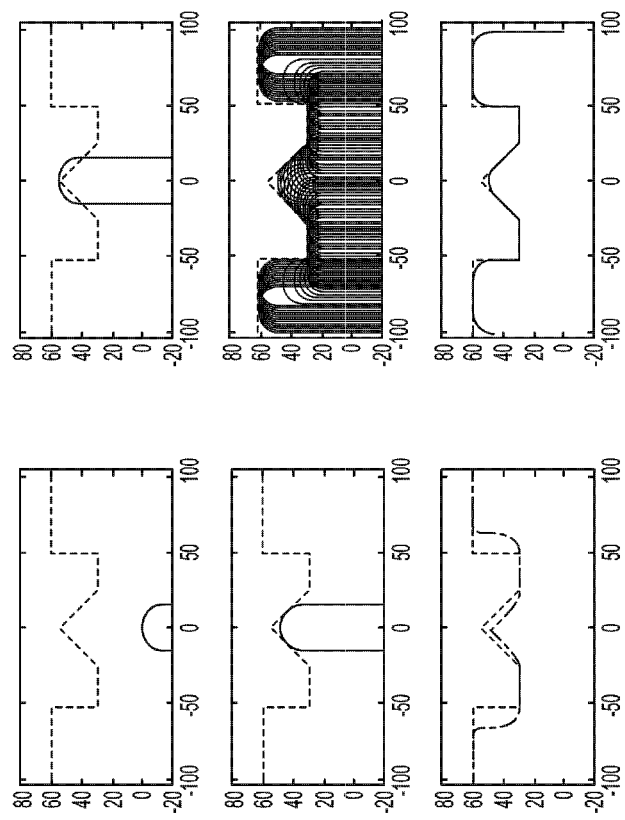
FIG. 11 is a block diagram showing, by way of example, progressive stages of the visibility analysis routine of FIG. 10.

The various stages of the visibility analysis algorithm can be shown. FIG. 11 is a block diagram showing, by way of example, progressive stages of the visibility analysis routine of FIG. 10. In the top-left block, the tool T (blue) and the part P (red) are shown as mapped in the tool's coordinate system. In the top-right block, for a given (X, Y) translation of the tool T, the Z$_{max}$(X, Y) is initialized to P$_{Hmap}$(X, Y). In the middle-left block, Z$_{max}$(X, Y) is translated in the −Z direction by the maximum penetration depth of the tool T, so that there is no collision with the part P. In the middle-right block, the algorithm is performed for all (X, Y). In the bottom-left block, $Z_{max}(X, n$ for $(x, y)\square(X, Y)$. Finally, in the bottom-right block, $R_{Hmap}(x, y)$ for $(x, y)\square(X, Y)$.

Rotating and Translating Tools

Assume that the tool T moves according to transformations in a set W, called the workspace, which is a subset of the configuration space SE(3) of spatial rigid transformations. The positions and orientations achievable by the tool T during its motion are described in terms of the location of a coordinate frame attached to the tool. Further assume that each such frame is initially aligned with a global reference frame with respect to which transformations are described. By implication, the workspace W also describes positions and orientations of the tool with respect to the absolute frame of reference. The origin of each frame is the reference point of T and indicates the special point of contact between the tool T and the raw stock S that will be used to analyze the allowable spatial locations of the tool T for manufacturability.

The maximal volume that is machinable from a raw stock S by each tool T can be formulated by simply extending Equations (1) and (2) to SE(3). Thus, the maximal machinable volume for each T is:

$$V = \delta((P^c \triangleright T) \cap W, T) \cap S \qquad (8)$$

The inherently six-dimensional computation can be broken down into smaller three-dimensional computations owing to the semi-direct product structure of $SE(3) = \mathbb{R}^3 \rtimes SO(3)$. In practice, the semi-direct product structure of SE(3) implies:

$$P^c \triangleright T_i = \bigcup_{r \in SO(3)} P^c \ominus T_r^{-1} \qquad (9)$$

Equation (9) presents a tractable computation of six-dimensional homogeneous quotients by breaking them down into several three-dimensional Minkowski difference computations. This computation requires a discretization of the three-dimensional group of rotations SO(3) in the workspace of the machine tool. Global discretization of SO(3) can be done in several ways, all of which rely on choosing discrete parameter values using some local or global discretization of the rotation group, such as described in S. Nelaturi et al., "Solving Inverse Configuration Space Problems by Adaptive Sampling," Symp. Solid & Phys. Model. 2012 (2012), the disclosure of which is incorporated by reference.

For the purposes of high-axis machining, typically available machine tool orientations are provided per axis. These orientations can be combined into a single searchable subset of SO(3) that includes all achievable orientations in the workspace using the configuration product, such as described in S. Nelaturi et al., "Configuration Products and Quotients in Geometric Modeling," Comp. Aid. Design (2012), the disclosure of which is incorporated by reference. For A, B$\square$SE(3), the configuration product is a C×C→C map defined as:

$$A \otimes B = \bigcup_{a \in A} a \cdot B \qquad (10)$$

In Equation (10), the '·' operator represents the group operation in SE(3) (or any of its subgroups). If elements in SE(3) are represented as 4×4 homogeneous transformation matrices, the '·' operator is equivalent to matrix multiplication.

Five-axis milling machines have rotational degrees of freedom about two axes of rotation, in addition to three translational motions. If rotations about the available axes are denoted $R_\Theta$ and $R_\Phi$, the subset of SO(3) for which the Minkowski difference in Equation (9) needs to be computed is given by $R = (R_\Theta \otimes R_\Phi) \cup (R_\Phi \otimes R_\Theta)$ owing to the non-commutativity of spatial rotation composition. The homogeneous quotient can be computed as:

$$P^c \triangleright T_i = \bigcup_{r \in R} P^c \ominus T_r^{-1} \qquad (11)$$

While the invention has been particularly shown and described as referenced to the embodiments thereof, those skilled in the art will understand that the foregoing and other changes in form and detail may be made therein without departing from the spirit and scope of the invention.

What is claimed:

1. A method for operating a computer numerical control (CNC) machining tool with the aid of a digital computer, comprising the steps of:
    providing a computer with parameters for a CNC machining tool comprising a plurality of orientations of the CNC machining tool while longitudinally traversing a rotating cutting edge;
    providing the computer with a model of a part defining surfaces of the part;
    providing the computer with a maximal set of translations for the CNC machining tool that avoids collisions between the rotating cutting edge and the surfaces of the part, each translation comprising one of the orientations of the CNC machining tool and a volume removable by the translation;
    computing in the computer an intersection of the translations within the maximal set and taking in the computer a union of the removal volumes for the intersecting translations;
    determining in the computer a largest space of the maximal set of the translations of the CNC machining tool outside of the surfaces of the part, which is machinable by the CNC machining tool;
    taking an intersection of the maximal set of the translations of the CNC machining tool in the computer as a maximal machinable volume for the CNC machining tool;
    evaluating the part in the computer based upon whether a union of the maximal machinable volumes substantially equals a negative volume of the part;
    programming the CNC machining tool with process plans downloaded by the computer and comprising machining operations by the CNC machining tool as conditioned upon the union substantially equaling the negative volume of the part; and
    operating the CNC machining tool per the machining operations in the downloaded process plans by machining off the removal volumes through longitudinal traversals of the rotating cutting edge over the surfaces of the part.

2. A non-transitory computer readable storage medium storing code for executing on a computer system to perform the method according to claim 1.

3. A method for operating a computer numerical control (CNC) machining tool with the aid of a digital computer, comprising the steps of:
    providing a computer with parameters for a CNC machining tool comprising a plurality of orientations of the CNC machining tool while longitudinally traversing a rotating cutting edge;

providing the computer with a model of a part defining surfaces of the part;
providing the computer with a maximal set of translations for the CNC machining tool that avoids collisions between the rotating cutting edge and the surfaces of the part, each translation comprising one of the orientations of the CNC machining tool and a volume removable by the translation;
computing in the computer an intersection of the translations within the maximal set and taking in the computer a union of the removal volumes for the intersecting translations;
computing in the computer a heightmap of the part orthographically to an approach of the CNC machining tool relative to the surfaces of the part from an origin of the CNC machining tool;
computing in the computer a heightmap of the CNC machining tool centered on the CNC machining tool's origin and looking towards a direction moving away from the surfaces of the part;
creating in the computer a heightmap of each removal volume comprising a volume created by sweeping the CNC machining tool over the surfaces of the part;
upon identifying in the computer a collision between an intersection of the CNC machining tool with the surfaces of the part for each point in the heightmap of the CNC machining tool, generating in the computer the translation of the CNC machining tool by a penetration depth of the CNC machining tool in the direction moving away from the surfaces of the part;
evaluating the part in the computer based upon whether a union of the non-colliding transformations of the CNC machining tool substantially equals the negative volume of the part;
programming the CNC machining tool with process plans downloaded by the computer and comprising machining operations by the CNC machining tool as conditioned upon the union substantially equaling a negative volume of the part; and
operating the CNC machining tool per the machining operations in the downloaded process plans by machining off the removal volumes through longitudinal traversals of the rotating cutting edge over the surfaces of the part.

4. A computer numerical control (CNC) machining tool operated with the aid of a digital computer, comprising:
 a CNC machining tool comprising a rotating cutting edge; and
 a computer, comprising:
  a storage device, comprising:
   parameters for the CNC machining tool comprising a plurality of orientations of the CNC machining tool while longitudinally traversing a rotating cutting edge; and
   a model of a part defining surfaces of the part; and
  a processor and memory within which code for execution by the processor is stored, further comprising:
   a tool evaluation module configured to determine in the computer a maximal machinable volume of the part for each of the orientations of the CNC machining tool, comprising:
    a translations module configured to compute in the computer a maximal set of translations of the CNC machining tool that avoids collisions between the rotating cutting edge and the surfaces of the part; and
    a volume module configured to determine in the computer a largest space of the maximal set of the translations of the CNC machining tool outside of the surfaces of the part, which is machinable by the CNC machining tool, and to take an intersection of the maximal set of the translations of the CNC machining tool in the computer as a maximal machinable volume for the CNC machining tool;
   a manufacturability module configured to evaluate the part in the computer based upon whether a union of the maximal machinable volumes substantially equals a negative volume of the part; and
   a programming module configured to program the CNC machining tool with process plans downloaded by the computer and comprising machining operations by the CNC machining tool; and
  wherein the CNC machining tool operates per the machining operations in the downloaded process plans by machining off the removal volumes through longitudinal traversals of the rotating cutting edge over the surfaces of the part.

5. A system according to claim 4, wherein the maximal set of the translations of the CNC machining tool T is determined as a homogeneous quotient in accordance with the equation:

$$P^c \triangleright T = P^c \ominus T^{-5}$$

where $P^c$ represents the compliment of part P.

6. A system according to claim 5, wherein the only positions reachable by the CNC machining tool in each orientation within the reachable workspace R of the CNC machining tool T are determined in accordance with the equation:

$$K = (P^c \ominus T^{-5}) \cap R$$

where $P^c$ represents the compliment of part P.

7. A system according to claim 4, wherein the maximal machinable volume $V_{max}$ for the CNC machining tool T is determined in accordance with the equation:

$$V_{max} = \delta(K,T) \cap S$$

where a maximal set and S is raw stock from which the part will be machined by the CNC machining tool T.

8. A method for operating a computer numerical control (CNC) machining tool with the aid of a digital computer, comprising the steps of:
 providing a computer with parameters for a CNC machining tool comprising a plurality of orientations of the CNC machining tool while longitudinally traversing a rotating cutting edge;
 providing the computer with a model of a part defining surfaces of the part;
 determining in the computer a maximal machinable volume of the part for each of the orientations of the CNC machining tool, comprising:
  computing in the computer a maximal set of translations of the CNC machining tool that avoids collisions between the rotating cutting edge and the surfaces of the part;
  determining in the computer a largest space of the maximal set of the translations of the CNC machining tool outside of the surfaces of the part, which is machinable by the CNC machining tool; and
  taking in the computer an intersection of the maximal set of the translations of the CNC machining tool as a maximal machinable volume for the CNC machining tool;
 evaluating the part in the computer based upon whether a union of the maximal machinable volumes substantially equals a negative volume of the part;

programming the CNC machining tool with process plans downloaded by the computer and comprising machining operations by the CNC machining tool; and operating the CNC machining tool per the machining operations in the downloaded process plans by machining off the removal volumes through longitudinal traversals of the rotating cutting edge over the surfaces of the part.

9. A method according to claim 8, further comprising the step of:

determining in the computer the maximal set of the translations of the CNC machining tool T as a homogeneous quotient in accordance with the equation:

$$P^c \triangleright T = P^c \ominus T^{-1}$$

where $P^c$ represents the compliment of part P.

10. A method according to claim 8, further comprising the step of:

finding in the computer the maximal set of translations of the CNC machining tool to only positions reachable by the CNC machining tool in each orientation.

11. A method according to claim 10, further comprising the step of:

determining in the computer the only positions reachable by the CNC machining tool in each orientation within the reachable workspace R of the CNC machining tool T in accordance with the equation:

$$K = (P^c \ominus T^{-1}) \cap R$$

where $P^c$ represents the compliment of part P.

12. A method according to claim 8, further comprising the step of:

determining in the computer the maximal machinable volume $V_{max}$ for the CNC machining tool T in accordance with the equation:

$$V_{max} = \delta(K, T) \cap S$$

where a maximal set and S is raw stock from which the part will be machined by the CNC machining tool T.

13. A method according to claim 8, further comprising the step of:

identifying in the computer a list of candidate process plans defined in terms of sequences of the maximal machinable volumes for the CNC machining tool.

14. A method according to claim 8, further comprising the step of:

building a manufacturing setup in the computer corresponding to a roster of CNC machining tools in a tools library comprising capabilities for each of the CNC machining tools in the tools library, comprising the steps of:

forming connections in the computer between the capabilities of the CNC machining tools in the tools library and uploaded geometric models; and providing the connections in the computer as qualitative process plans.

15. A non-transitory computer readable storage medium storing code for executing on a computer system to perform the method according to claim 8.

16. A computer numerical control (CNC) machining tool operated with the aid of a digital computer, comprising:

a CNC machining tool comprising a rotating cutting edge; and a computer, comprising:

a storage device, comprising:

parameters for the CNC machining tool comprising a plurality of orientations of the CNC machining tool while longitudinally traversing a rotating cutting edge; and a model of a part defining surfaces of the part, wherein the part lacks undercut features; and a processor and memory within which code for execution by the processor is stored, further comprising:

a tool evaluation module configured to determine in the computer non-colliding transformations of the CNC machining tool, comprising:

a heightmap module configured to compute in the computer a heightmap of the part orthographically to an approach of the CNC machining tool relative to the surfaces of the part from an origin of the CNC machining tool, to compute in the computer a heightmap of the CNC machining tool centered on the CNC machining tool's origin and looking towards a direction moving away from the surfaces of the part, and to create in the computer a heightmap of a removal volume comprising a volume created by sweeping the CNC machining tool over the surfaces of the part; and a translation module configured to generate in the computer a translation of the CNC machining tool by a penetration depth of the CNC machining tool in the direction moving away from the surfaces of the part upon identifying in the computer a collision between an intersection of the CNC machining tool with the surfaces of the part for each point in the heightmap of the CNC machining tool;

a manufacturability module configured to evaluate the part in the computer based upon whether a union of the non-colliding transformations of the CNC machining tool substantially equals a negative volume of the part; and a programming module configured to program the CNC machining tool with process plans downloaded by the computer and comprising machining operations by the CNC machining tool; and wherein the CNC machining tool operates per the machining operations in the downloaded process plans by machining off the removal volumes through longitudinal traversals of the rotating cutting edge over the surfaces of the part.

17. A system according to claim 16, wherein the non-colliding transformations of the CNC machining tool T are determined as a maximal machinable volume $V_{max}$ in accordance with the equation:

$$V_{max} = \delta(P_{acc}, T) \cap S$$

where $\delta( )$ is a Minkowski sum, $P_{acc}$ is the accessible boundary of the part P and S is a staging model for raw stock from which the part P will be machined by the CNC machining tool T.

18. A system according to claim 16, wherein the non-colliding transformations of the CNC machining tool T are determined in six-dimensional space as a homogeneous quotient in accordance with the equation:

$$P^c \triangleright T_i = \bigcup_{r \in R} P^c \ominus T_r^{-1}$$

where $P^c$ is a maximal set of the translations applicable to tool T in dimension i without collision c with part P.

19. A method for operating a computer numerical control (CNC) machining tool with the aid of a digital computer, comprising the steps of:
providing a computer with parameters for a CNC machining tool comprising a plurality of orientations of the CNC machining tool while longitudinally traversing a rotating cutting edge;
providing the computer with a model of a part defining surfaces of the part, wherein the part lacks undercut features;
determining in the computer non-colliding transformations of the CNC machining tool, comprising:
computing in the computer a heightmap of the part orthographically to an approach of the CNC machining tool relative to the surfaces of the part from an origin of the CNC machining tool;
computing in the computer a heightmap of the CNC machining tool centered on the CNC machining tool's origin and looking towards a direction moving away from the surfaces of the part;
creating in the computer a heightmap of a removal volume comprising a volume created by sweeping the CNC machining tool over the surfaces of the part; and
upon identifying a collision in the computer between an intersection of the CNC machining tool with the surfaces of the part for each point in the heightmap of the CNC machining tool, generating in the computer a translation of the CNC machining tool by a penetration depth of the CNC machining tool in the direction moving away from the surfaces of the part;
evaluating the part in the computer based upon whether a union of the non-colliding transformations of the CNC machining tool substantially equals a negative volume of the part; and
programming the CNC machining tool with process plans downloaded by the computer and comprising machining operations by the CNC machining tool; and
operating the CNC machining tool per the machining operations in the downloaded process plans by machining off the removal volumes through longitudinal traversals of the rotating cutting edge over the surfaces of the part.

20. A method according to claim 19, further comprising the step of:
forming in the computer the respective heightmaps of the part, the CNC machining tool and the removal volume as z-buffers.

21. A method according to claim 19, further comprising the step of:
determining in the computer the non-colliding transformations of the CNC machining tool T as a maximal machinable volume $V_{max}$ in accordance with the equation:
$$V_{max} = \delta(P_{acc}, T) \cap S$$
where $\delta(\ )$ is a Minkowski sum, $P_{acc}$ is the accessible boundary of the part P and S is a staging model for raw stock from which the part P will be machined by the CNC machining tool T.

22. A method according to claim 19, further comprising the step of:
determining in the computer the non-colliding transformations of the CNC machining tool T in six-dimensional space as a homogeneous quotient in accordance with the equation:
$$P^c \triangleright T_i = \bigcup_{r \in R} P^c \ominus T_r^{-1}$$
where $P^c$ is a maximal set of the translations applicable to tool T in dimension i without collision c with part P.

23. A method according to claim 19, further comprising the steps of:
identifying in the computer a list of candidate process plans defined in terms of sequences of the maximal machinable volumes for the CNC machining tool.

24. A method according to claim 19, further comprising the step of:
building a manufacturing setup in the computer corresponding to a roster of CNC machining tools in a tools library comprising capabilities for each of the CNC machining tools in the tools library, comprising the steps of:
forming connections in the computer between the capabilities of the CNC machining tools in the tools library and uploaded geometric models; and
providing the connections in the computer as qualitative process plans.

25. A non-transitory computer readable storage medium storing code for executing on a computer system to perform the method according to claim 19.

* * * * *